United States Patent [19]

Sakata

[11] Patent Number: 5,093,700

[45] Date of Patent: Mar. 3, 1992

[54] SINGLE GATE STRUCTURE WITH OXIDE LAYER THEREIN

[75] Inventor: Masanori Sakata, Tokyo, Japan

[73] Assignee: NEC Electronics Inc., Mountain View, Calif.

[21] Appl. No.: 683,517

[22] Filed: Apr. 8, 1991

Related U.S. Application Data

[63] Continuation of Ser. No. 456,003, Dec. 20, 1989, abandoned.

[51] Int. Cl.$^5$ .................. H01L 27/01; H01L 29/78; H01L 29/04; H01L 29/34
[52] U.S. Cl. .................. 357/23.1; 357/23.15; 357/59; 357/23.5; 357/54; 437/191
[58] Field of Search .................. 357/23.15, 59, 23.1, 357/23.5, 54, 48; 437/191

[56] References Cited

U.S. PATENT DOCUMENTS

| | | | |
|---|---|---|---|
| 4,142,926 | 3/1979 | Morgan | 357/59 |
| 4,494,301 | 1/1985 | Faraone | 357/59 |

*Primary Examiner*—Rolf Hille
*Assistant Examiner*—Wael Fahmy
*Attorney, Agent, or Firm*—Skjerven, Morrill, MacPherson, Franklin & Friel

[57] ABSTRACT

A FET transistor has a gate structure consisting of at least three layers of polysilicon with a thin oxide layer on the order of atoms thick separating each of the layers. A method for formation of the multilayer gate structure and the formation of resistors comprised of layers of polysilicon separated by oxide layers are also provided.

12 Claims, 2 Drawing Sheets

5,093,700

SINGLE GATE STRUCTURE WITH OXIDE LAYER THEREIN

This application is a continuation of application Ser. No. 07/456,003, filed Dec. 20, 1989 now abandoned.

BACKGROUND OF THE INVENTION

1. Field of the Invention

The invention relates generally to semiconductor devices and more specifically to a semiconductor device having a gate structure or a resistor comprised of multiple layers of polysilicon where each layer of polysilicon is separated from the adjacent polysilicon layers by a thin oxide layer.

2. Description of the Prior Art

A typical field effect transistor (FET) 50 with a polysilicon gate 15 is shown in FIG. 1. The transistor 50 has a first region 10 of N+ conductivity type formed in a P conductivity type (P-type) semiconductor substrate 11. Region 10 functions as the source region of transistor 50. Laterally spaced a selected distance 14, the channel length, from source region 10 of N+ conductivity type is a second region 12 of N+ conductivity type in substrate 11. Region 12 functions as the drain of transistor 50. The region in the substrate 11 between source and drain regions 10, 12 functions as a channel region 14. A thin gate oxide layer 13 is disposed on substrate 11 so that the oxide layer 13 overlies source region 10, drain region 12, and channel region 14. Polysilicon gate 15 is formed on gate oxide layer 13. Ions of P-type conductivity impurities are implanted in the periphery of transistor 50 to form channel-stopper regions 18. A field oxide layer 17 overlies each of the regions 18. An additional oxide layer 16 overlies field oxide 17, gate oxide layer 13, and polysilicon gate 15. Finally, a drain electrode 19 and a source electrode 20 contact drain region 10 and source region 12 respectively through oxide layer 16 and gate oxide layer 13.

In a typical fabrication of transistor 50, thin gate oxide 13 is first grown on P-type substrate 11. A thick layer of silicon nitride, which functions both as an implant barrier for ion implantation and an oxidation mask, is deposited over oxide layer 13. The silicon nitride layer is removed from areas except for the areas where source region 10, drain region 12 and channel region 14 of transistor 50 are to be formed. After removal of the silicon nitride layer, P-type impurity ions are implanted to form the channel-stopper regions 18. The silicon nitride layer prevents ion implantation in the region where the source region 10, drain region 12 and channel regions 14 are to be formed. After the P-type ion implantation, substrate 11 is again oxidized to form field oxide region 17. During this operation, the silicon nitride layer functions as an oxidation mask to prevent the oxidation of the regions where the source region 10, drain region 12 and channel region 14 are to be formed.

After the oxidation step, the remaining silicon nitride layer is removed and then N-type conductivity impurity ions are implanted to form source region 10 and drain region 12. A polysilicon layer is then grown over the gate oxide layer 13. Using a mask, the polysilicon layer is etched, to form the polysilicon gate 15 and any necessary polysilicon interconnect lines (not shown). After formation of gate 15, source region 10 and drain region 12 are formed by using gate 15 as a dopant mask. Source and drain regions 10, 12 are typically formed by ion implantation. In some applications, gate 15 is doped prior to formation of source region 10 and drain region 12. After formation of source region 10 and drain region 12, oxide layer 16 is grown, and then a mask is used to form vias to source region 10 and drain region 12 respectively. Subsequently the drain and source electrodes 19 and 20 are formed by depositing a metal layer and then etching it by using one or more additional mask steps.

The use of the above-described self-aligning gate structure, i.e., the formation of source region 10 and drain region 12 using gate 15 as a mask, eliminates problems associated with metal-gate fabrication processes and consequently enhances the high frequency characteristics of transistor 50 compared with a transistor having a metal gate. However, the accuracy of location of gate 15 and source and drain regions 10, 12 formed by the self-aligning gate process depends highly upon the etching of the polysilicon layer which is in turn dependent upon the thickness of the polysilicon layer.

Typically, the polysilicon layer is etched using a plasma-etching process. Unfortunately, as illustrated in an expanded view in FIG. 2, the plasma-etching produces an upper surface 15a that is broader than a bottom surface 15b. As a result of etching of the polysilicon layer, drain and source regions 10, 12 separate from the bottom surface 15b of the polysilicon, to make transistor 50 inoperable. This is because upper surface 15a prevents impurity ions from being implanted into substrate 11 in the vicinity of the bottom surface 15b.

More specifically, if the source and drain regions 10, 12 are separated from the bottom surface 15b, the electrical path between the source and drain regions 10, 12 through channel region 14 discontinues so as to lose the transistor action. Moreover, even if transistor 50 functions, the electrical characteristic is unstable, so as to differ amongst several transistors formed simultaneously. The polysilicon layer has a poor smoothness in the upper surface and its thickness is not constant on the same substrate 11. This thickness variation results in variations in the distance between the upper and bottom surfaces 15a, 15b which cause variations in the operational characteristics of transistors formed in the same fabrication process.

One of the causes for the variations in the thickness of the polysilicon layer is the effective grain size of the polysilicon. If the grains are large, significant indentations can occur between adjacent grain boundaries. These indentations affect not only the etching but also the mask alignment because the mask must be applied over the polysilicon layer. Hence, the polysilicon gate-type FET (as in FIG. 1), while having a better frequency response than other types of insulated gate FET's, still has several disadvantages which affect both yield and electrical performance.

One attempted solution to the problems associated with the polysilicon grain size and the etching was to form the polysilicon gate in two steps. In this fabrication process, a layer equivalent to one-half the thickness of the polysilicon gate was first formed. The one-half thickness polysilicon layer was covered by a thin oxide layer and then another polysilicon layer, equivalent to one-half the thickness of the polysilicon gate, was formed on the thin oxide layer.

When the double layer of polysilicon separated by the oxide layer was etched to form the polysilicon gate, the effect of etching was less than on the single-layer polysilicon gate structure in the prior art transistor described above. Also, the upper surface of the polysilicon layer was somewhat smoother because the reduced thickness resulted in a smaller grain size. However, while the double layer polysilicon gate functions satisfactorily, the yield and performance characteristics were not significantly enhanced over the prior art transistors.

SUMMARY OF THE INVENTION

The transistor of the present invention overcomes the problems in the prior art FET and provides a FET with enhanced operational capabilities while yields are simultaneously enhanced. The conventional FET gate structure is replaced with a gate structure having at least three layers of a first material with a very thin layer of a second material separating each of the layers of the first material wherein the multilayer gate structure has overall size characteristics equivalent to the size characteristics of a prior art FET gate structure. In one embodiment, the first material includes polysilicon and the very thin layer of a second material comprises an oxide layer, on the order of atoms thick. Since the multilayer gate structure has the same thickness and shape as a typical gate structure, the transistor of this invention operates in a manner equivalent to a conventional FET.

Enhanced performance and yield are obtained because polysilicon grain size and the effects of etching of polysilicon are minimized in formation of the multilayer gate structure. Moreover, when the source and drain regions are formed using the multilayer polysilicon gate as a dopant mask, the source and drain regions are stably connected through the channel produced under the multilayer polysilicon gate because the sides of the gate structure are substantially vertical with respect to the substrate surface and mask misalignment has been minimized.

The multilayer polysilicon/oxide structure is also useful for resistors at selected locations on a semiconductor substrate. Electrodes are formed to contact different parts of the uppermost polysilicon layer. The very thin oxide layer, again on the order of atoms thick, between the polysilicon layers allows the current to flow therethrough. The current flowing between the polysilicon layers can be controlled by the thickness of the thin oxide layer. Therefore, controlling the thickness of the oxide layers and the thickness and the number of the polysilicon layers permits formation of a resistor having a selected resistance. As usual, the resistance of the resistor is mainly controlled by the distance between the electrodes.

DETAILED DESCRIPTION

Figure 1:
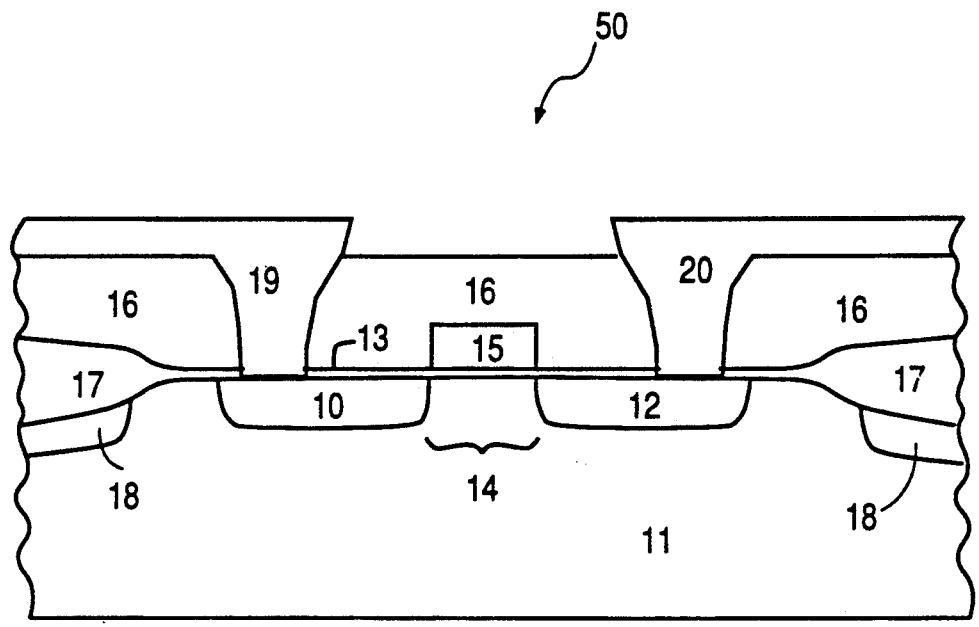
FIG. 1 is a sectional view of a prior art field effect transistor.
Figure 3:
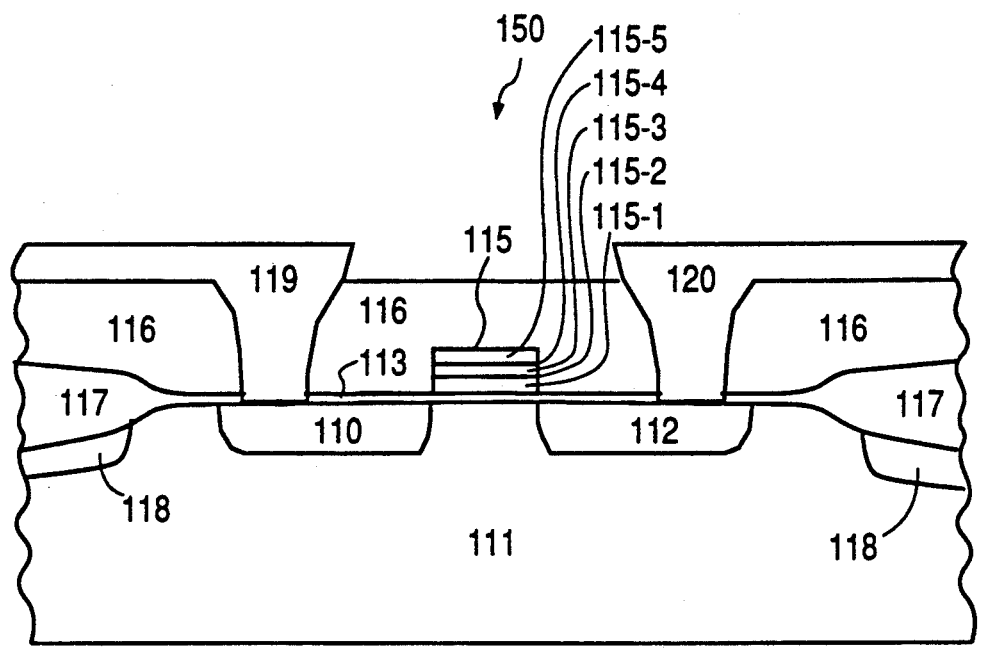
FIG. 3 is a sectional view of the transistor according to the present invention having a multilayer polysilicon gate.

Transistor 150 of the present invention is illustrated in FIG. 3. In one embodiment, transistor 150 has a polysilicon gate 115 formed of alternating layers of a first material, e.g. polysilicon, and a second material, e.g. silicon dioxide. The other elements of transistor 150 are identical to those described above for transistor 50 (FIG. 1), and that description is incorporated herein by reference. As is described more completely below, transistor 150 with a multilayer polysilicon/oxide gate structure significantly reduces problems associated with polysilicon grain size and polysilicon etching over prior art polysilicon gate structures. Consequently, yield and performance are enhanced when transistor 150 is utilized instead of transistor 50 (FIG. 1).

The important feature of this invention is the formation of gate 115 (FIG. 3) in multiple stages with alternating layers of a first and a second material. For example, a three-layer polysilicon gate structure 115 is formed by depositing about one-third of the polysilicon 115-1, growing a first thin layer of silicon dioxide 115-2 on layer 115-1, depositing approximately another third of the polysilicon 115-3 on layer 115-2, growing a second thin layer of silicon dioxide 115-4 on layer 115-3, and depositing approximately the final third of the polysilicon 115-5 on layer 115-4. As used herein, the fractions of polysilicon are relative to the typical thickness of a prior art polysilicon gate structure. Also, in other embodiments, the typical thickness of the gate structure could be divided, for example, into 4, or more polysilicon layers with an oxide layer interposed between the polysilicon layers.

In a preferred embodiment, the polysilicon is deposited by low pressure chemical vapor deposition (LPCVD). To form transistor 150 the substrate 111 is processed as described above for transistor 50 (FIG. 1) up to the formation of the polysilicon layer from which the gate structure and interconnects are formed. The first deposition of a polysilicon layer for gate structure 115 is accomplished using silane ($SiH_4$) at a pressure in the range of about 0.2 to about 0.8 torr (preferably about 0.4 torr) and a temperature in the range of about 600° C. to about 650° C. (preferably about 650° C.). The time of the deposition depends upon the thickness of the first layer. After formation of the first polysilicon layer to the desired thickness, the semiconductor wafer exposed to oxidizing conditions for a period in the range of one to three minutes. The oxidizing conditions include a temperature in the range of 600° C. to 900° C.; an oxygen concentration of 0.01% to 100% which is diluted by argon; and pressure of 0.1 torr to 760 torr. In one embodiment, the oxide layer was formed using an atmospheric horizontal furnace filled with 1% oxygen and 99% argon at about one atmosphere and about 800° C. For these conditions, the oxide layer grows to perhaps several atoms thick. Hence, as used herein, a thin layer (sometimes referred to as "a very thin layer") interposed between polysilicon layers means a layer on the order of several atoms thick in a range from 1 to 5 Å.

Next $SiH_4$ at a pressure in the range of about 0.2 to about 0.8 torr (preferably about 0.4 torr) and at a temperature in the range of about 600° C. to about 650° C. (preferably about 650° C.) is introduced for sufficient time to grow the second polysilicon layer of the gate on the first very thin oxide layer. The procedure continues alternating between steps of very thin oxide layer formation and polysilicon layer formation until the desired number of polysilicon layers is formed in the gate structure. Also, the polysilicon layers could be doped in a manner equivalent to the prior art method for doping a polysilicon gate structure. Transistor 150 as provided with a multilayer gate 115 operates properly.

The insertion of very thin oxide layers 115-2 and 115-4 between the layers of polysilicon permits control of the resistivity of the polysilicon layer because the very thin oxide layer acts as a resistor. Normally if the polysilicon layer is made thicker the resistivity goes down, but when it is desirable to use the polysilicon layer as a resistor, the insertion of the thin oxide layers increases the resistivity of the layer. Thus, a resistor of a selected size is easily formed at a selected location by forming multiple alternating layers of silicon dioxide and polysilicon at the selected location.

The grain size in a polysilicon layer is determined by many factors such as the temperature, pressure and thickness. However, in the process according to the present invention, the thickness is controlled by having multiple polysilicon layers wherein each polysilicon layer has a thickness less than one-half the thickness of a conventional polysilicon gate structure. The grain size is limited by the thickness of the polysilicon layer. Accordingly, the upper surface of the polysilicon gate structure has a grain size associated with the thickness of the last layer of polysilicon in the gate and not the thickness of the entire gate structure, as in the prior art devices. The resulting polysilicon/oxide structure therefore has a smooth upper surface relative to prior art surfaces. This smooth surface is advantageous in any subsequent masking operations because the smooth surface provides better alignment of the mask which in turn enhances yield.

Figure 2:
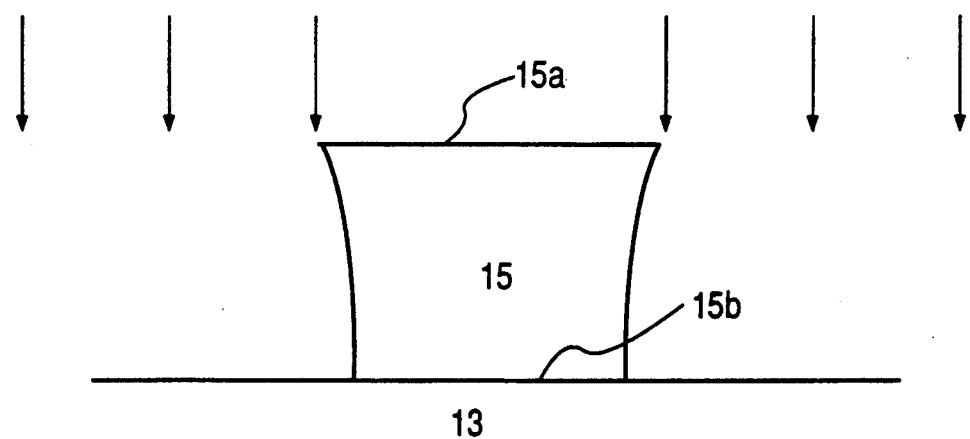
FIG. 2 is an expanded sectional view of the prior art gate structure illustrating the effect of anisotropic etching of the polysilicon layer.
Figure 4:
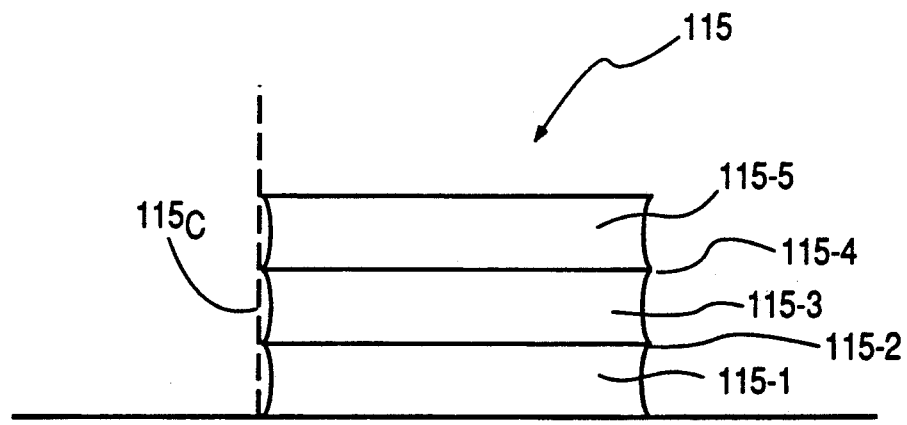
FIG. 4 is an expanded sectional view of the gate structure according to the present invention illustrating that the multilayer gate structure has an edge surface substantially perpendicular to the substrate surface.

As previously described, when the polysilicon gate is formed by etching, undercutting of the lower part of polysilicon during anisotropic etching results in the polysilicon layer having a nonuniform width as previously described. (See FIG. 2.) However, the intermittent thin oxide layers impede the etching process so that the width of the gate structure is more uniform in the vertical direction than in the prior art devices. Specifically, the etch rate of an oxide layer during the plasma etch is significantly smaller than the etch rate of a polysilicon layer. Consequently, the very thin oxide layers in the multilayer gate structure of this invention limit the undercutting of polysilicon layers beneath the oxide layers. An expanded view of gate 115 after etching is presented in FIG. 4. Edge surface 115C of gate structure 115 after etching is more nearly perpendicular to the substrate surface than the prior art structures, described above.

When ion implantation is used to form the source and drain regions of the transistor of the present invention, gate 115 is used as a mask as previously described. After thermal diffusion concentrates the dopant in the source and drain region, and couples gate structure 115 with source region 110 and drain region 112, there is only a very small overlap between source region 110 and a first edge of the gate structure, and between drain region 112 and a second edge of the gate structure. Accordingly, the capacitance between the gate and the source and drain regions 110, 112 is minimized, with the result that the transistor of this embodiment is suitable for high speed operation. Moreover, the yield is enhanced because of the uniformity of the gate structure and the operational variation from transistor to transistor within a die is minimized.

While my invention has been described with respect to a polysilicon gate FET with regions of specific conductivities, the principles of the invention are applicable to either depletion or enhancement mode FETs as well as FETs having regions of opposite conductivities. Moreover, the multilayer polysilicon/thin oxide structure may be utilized in place of a conventional polysilicon layer in any semiconductor device. The multilayer polysilicon/thin oxide structure is advantageous in any device where mask alignment is affected by the smoothness of the polysilicon surface and where the multilayer polysilicon/thin oxide structure is utilized as a mask for a subsequent process step. Accordingly, the disclosed embodiment illustrates the principles of the invention and is not intended to limit the scope of the invention.

I claim:

1. A semiconductor device having a single conductive gate structure comprised of at least:
   a first layer of a first material;
   a first layer of a second material disposed on the first layer of the first material;
   a second layer of the first material disposed on the first layer of the second material;
   a second layer of the second material disposed on the second layer of the first material; and
   a third layer of the first material disposed on the second layer of the second material; wherein the single conductive gate structure is capable of carrying an electric current which passes through all of the layers.

2. A semiconductor device, as in claim 1, wherein the first material is comprised of polysilicon.

3. A semiconductor device, as in claim 2, wherein the polysilicon layers are doped.

4. A semiconductor device, as in claim 1 wherein the second material is comprised of silicon dioxide and each layer of the second material is no more than 5 Å thick.

5. A semiconductor device, as in claim 1, wherein the structure is a gate of a transistor.

6. A semiconductor device, as in claim 1, wherein the structure is a resistor.

7. A field effect transistor having a source region, a drain region and a single gate structure, said single gate structure comprising:
   a first polysilicon layer, a first oxide layer no more than 5 Å thick disposed on the first silicon layer, a second silicon layer disposed on the first oxide layer, a second oxide layer disposed on the second silicon layer, and a third silicon layer disposed on the second oxide layer; wherein the single gate structure carries an electric current which flows through all the layers.

8. A semiconductor device, as in claim 7, wherein the silicon layers are comprised of polysilicon.

9. A semiconductor device, as in claim 8, wherein the polysilicon layers are doped.

10. A semiconductor device having a single conductive gate structure comprising:
    a first polysilicon layer;
    a first layer of insulating material no more than 5 Å thick formed on the first polysilicon layer;
    a second polysilicon layer formed on the first layer of insulating material;
    a second layer of insulating material no more than 5 Å thick formed on the second polysilicon layer; and a third polysilicon layer formed on the second layer of insulating material;

wherein an electric current flows from the first polysilicon layer to the third polysilicon layer through the first and second insulating layers of the single conductive gate structure.

11. A field effect transistor having a source region, a drain region and a gate structure, said gate structure comprising:

a first polysilicon layer, a first oxide layer disposed on the first silicon layer, a second silicon layer disposed on the first oxide layer, a second oxide layer disposed on the second silicon layer, and a third silicon layer disposed on the second oxide layer wherein the gate structure carries an electric current which flows through all the layers, and a total thickness of the gate structure is about equal to that of a single polysilicon gate.

12. A semiconductor device having a conductive gate structure comprising:

a first polysilicon layer;

a first layer of insulating material no more than 5 Å thick formed on the first polysilicon layer;

a second polysilicon layer formed on the first layer of insulating material;

a second layer of insulating material no more than 5 Å thick formed on the second polysilicon layer; and a third polysilicon layer formed on the second layer of insulating material;

wherein an electric current flows from the first polysilicon layer to the third polysilicon layer through the first and second insulating layers, and a total thickness of the gate structure is about equal to that of a single polysilicon gate.

* * * * *